(12) United States Patent
Oguri et al.

(10) Patent No.: US 8,359,922 B2
(45) Date of Patent: Jan. 29, 2013

(54) TUNING FORK-TYPE VIBRATOR, TUNING FORK-TYPE VIBRATOR MANUFACTURING METHOD, AND ANGULAR VELOCITY SENSOR

(75) Inventors: Shinya Oguri, Nagaokakyo (JP); Jun Tabota, Nagaokakyo (JP); Masato Koike, Nagaokakyo (JP); Tomohiko Kiyohara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 26 days.

(21) Appl. No.: 13/036,126

(22) Filed: Feb. 28, 2011

(65) Prior Publication Data
US 2011/0174073 A1      Jul. 21, 2011

Related U.S. Application Data

(63) Continuation of application No. PCT/JP2009/060738, filed on Jun. 12, 2009.

(30) Foreign Application Priority Data

Sep. 2, 2008  (JP) .................. 2008-224568

(51) Int. Cl.
 *G01P 9/04*   (2006.01)
 *G01C 19/56*  (2006.01)
(52) U.S. Cl. .................. 73/504.16; 73/514.34
(58) Field of Classification Search ............. 73/504.16, 73/514.34
See application file for complete search history.

(56) References Cited

U.S. PATENT DOCUMENTS

| | | | |
|---|---|---|---|
| 6,564,639 B1 * | 5/2003 | Hatanaka et al. | 73/504.16 |
| 7,096,733 B2 * | 8/2006 | Ohta et al. | 73/504.16 |
| 7,185,540 B2 * | 3/2007 | Torii et al. | 73/504.16 |
| 7,805,995 B2 | 10/2010 | Oguri et al. | |
| 2005/0150298 A1 | 7/2005 | Fujimoto et al. | |

FOREIGN PATENT DOCUMENTS

| | | |
|---|---|---|
| JP | 10-311727 A | 11/1998 |
| JP | 2000-249560 A | 9/2000 |
| JP | 2004-61486 A | 2/2004 |
| JP | 2006-194818 A | 7/2006 |
| JP | 3969459 B1 | 9/2007 |
| JP | 2007-263775 A | 10/2007 |
| JP | 2008-14894 A | 1/2008 |
| JP | 2008-157856 A | 7/2008 |

OTHER PUBLICATIONS

Official Communication issued in International Patent Application No. PCT/JP2009/060738, mailed on Jul. 7, 2009.

* cited by examiner

*Primary Examiner* — Daniel Larkin
(74) *Attorney, Agent, or Firm* — Keating & Bennett, LLP

(57) ABSTRACT

A tuning fork-type vibrator includes a tuning fork-type vibrating body including a base and legs. The tuning fork-type vibrating body includes two piezoelectric substrates, an intermediate electrode, surface electrodes and an entire-surface electrode that are laminated together. The surface electrodes are separated by separating portions extending from the base to each of the legs. The widths of the separating portions at a point of connection to the circuit board are wider than those of the separating portions at other points. The separating portions are formed by dividing an electrode provided on the entire surface of a piezoelectric substrate in the vibrating body with a dicer or by laser radiation or etching.

8 Claims, 7 Drawing Sheets

TUNING FORK-TYPE VIBRATOR, TUNING FORK-TYPE VIBRATOR MANUFACTURING METHOD, AND ANGULAR VELOCITY SENSOR

BACKGROUND OF THE INVENTION

1. Field of the Invention

The present invention relates to tuning fork-type vibrators, tuning fork-type vibrator manufacturing methods, and angular velocity sensors and, more particularly, to a tuning fork-type vibrator used to detect an angular velocity in an angular velocity sensor, a method of manufacturing the tuning fork-type vibrator, and an angular velocity sensor including the tuning fork-type vibrator.

2. Description of the Related Art

FIG. 11 is a perspective view of an example of a tuning fork-type vibrator in the related art. A tuning fork-type vibrator 1 includes a vibrating body including a rectangular base 2a and two legs 2b and 2c extending from one end of the base 2a in parallel to each other. The vibrating body includes two fork-type piezoelectric substrates 3a and 3b. An intermediate metal layer 4 is disposed between the piezoelectric substrates 3a and 3b. Three electrodes 5a, 5b, and 5c are arranged on the surface of the piezoelectric substrate 3a. The electrodes 5a, 5b, and 5c are separated from one another by two separating portions extending linearly from the base 2a to the legs 2b and 2c. An entire-surface electrode 6 is arranged on the surface of the vibrating body 3b. In the tuning fork-type vibrator 1, the piezoelectric substrates 3a and 3b are polarized in opposite directions along the thickness thereof.

The tuning fork-type vibrator 1 is attached to a circuit board. At that time, the three electrodes 5a, 5b, and 5c on the piezoelectric substrate 3a are mechanically and electrically connected to electrodes provided on the circuit board by a conductive adhesive. A driving circuit is connected between the electrode 5b, which is the middle one of the three electrodes 5a, 5b, and 5c on the piezoelectric substrate 3a, and each of the outer electrodes 5a and 5c. A detection circuit for detecting a rotational angular velocity is connected to the outer electrodes 5a and 5c. The driving circuit vibrates the legs 2b and 2c in the tuning fork-type vibrator 1 so that they move toward and away from each other. At that time, since the legs 2b and 2c move in the same direction with respect to the direction of polarization, the electrodes 5a and 5c connected to the detection circuit output the same signal. When the detection circuit calculates the difference between signals output from the electrodes 5a and 5c, the difference therefore becomes zero.

In this state, when a rotational angular velocity about a central axis between the legs 2b and 2c is applied, a Coriolis force is applied to the legs 2b and 2c along an axis perpendicular to the direction of vibration. Since the legs 2b and 2c move toward and away from each other in the fundamental vibration, the directions of Coriolis forces applied to the legs 2b and 2c are opposite to each other. Accordingly, the legs 2b and 2c move in opposite directions along an axis perpendicular to the direction of fundamental vibration. These movements of the legs 2b and 2c change output signals from the two electrodes 5a and 5c in opposite phases. When the detection circuit calculates the difference between these output signals, the detection circuit obtains a signal corresponding to the rotational angular velocity (see, for example, Japanese Patent No. 3969459).

In the tuning fork-type vibrator, three electrodes used to drive and detect are provided on one of the piezoelectric substrates. When the widths of the separating portions between electrodes are narrow and the electrodes on the piezoelectric substrate are connected to the electrodes on the circuit board by a conductive adhesive, the electrodes may become short circuited by the conductive adhesive and the insulation reliability is reduced. When the widths of the separating portions between electrodes are increased, the areas of the electrodes on the legs are reduced. As a result, the driving efficiency of the tuning fork-type vibrator and the outputting efficiency of a signal generated by the movements of the legs are reduced. This leads to a reduction in the sensitivity of the tuning fork-type vibrator and a degradation in an S/N ratio.

SUMMARY OF THE INVENTION

To overcome the problems described above, preferred embodiments of the present invention provide a tuning fork-type vibrator that ensures a high insulation reliability when the tuning fork-type vibrator is disposed on a circuit board and that has a high vibration sensitivity and an outstanding S/N ratio, and a method of efficiently manufacturing such a tuning fork-type vibrator.

A tuning fork-type vibrator according to a preferred embodiment of the present invention preferably includes a tuning fork-type vibrating body that includes a piezoelectric substrate and includes a base and legs extending in parallel or substantially parallel from the base, and three surface electrodes that extend from the base to the legs on one surface of the vibrating body and that are connected to a circuit board at the base. The three surface electrodes are preferably separated by separating portions extending from the base to the legs. Widths of the separating portions at least a portion of the base at which the three surface electrodes are connected to the circuit board are preferably greater than those of the separating portions at the legs.

Since the widths of the separating portions between the surface electrodes at least a portion of the base at which the three surface electrodes are connected to the circuit board are preferably greater than those of the separating portions at the legs, the probability that the three surface electrodes are short circuited by a conductive adhesive or other conductive member at the portion of the base is significantly reduced. The three surface electrodes may preferably have large electrode areas at the legs.

A tuning fork-type vibrator manufacturing method according to a preferred embodiment of the present invention is a method of manufacturing the above-described tuning fork-type vibrator, and preferably includes forming an electrode on a piezoelectric substrate included in the vibrating body and forming the separating portions having non-uniform widths at least in a portion in the electrode with a dicer.

A tuning fork-type vibrator manufacturing method according to another preferred embodiment of the present invention is a method of manufacturing the above-described tuning fork-type vibrator, and preferably includes forming an electrode on a piezoelectric substrate included in the vibrating body and forming the separating portions having non-uniform widths at least in a portion in the electrode by laser radiation.

A tuning fork-type vibrator manufacturing method according to another preferred embodiment of the present invention is a method of manufacturing the above-described tuning fork-type vibrator, and preferably includes forming an electrode on a piezoelectric substrate included in the vibrating body and forming the separating portions having non-uniform widths at least in a portion in the electrode by etching.

In order to form separating portions with non-uniform widths in an electrode formed on a piezoelectric substrate included in a vibrating body, a method using a dicer, a laser radiation method, or an etching method may preferably be used. For example, when a dicer is used, it is possible to partially widen the separating portions between the surface electrodes by using dicing blades whose cut widths are different or bringing a dicing blade into contact with the electrode a plurality of times.

When the laser radiation method is used, a separating portion having a predetermined width and a predetermined shape can be formed by changing a laser radiation position.

When the etching method is used, it is possible to accurately obtain the width between surface electrodes by forming a dividing pattern having a predetermined shape and removing an electrode based on the dividing pattern.

An angular velocity sensor according to a preferred embodiment of the present invention includes the tuning fork-type vibrator according to a preferred embodiment of the present invention or a tuning fork-type vibrator manufactured using a tuning fork-type vibrator manufacturing method according to a preferred embodiment of the present invention.

According to various preferred embodiment of the present invention, by increasing the widths of separating portions between portions of surface electrodes connected to a circuit board, the probability that the surface electrodes are short circuited by an conductive adhesive or other conductive member is significantly reduced and the insulation reliability is significantly increased. In addition, since the surface electrodes have large electrode areas at the legs, the driving efficiency of the tuning fork-type vibrator, the outputting efficiency of a signal generated by displacements of the legs, and the sensitivity of the tuning fork-type vibrator are significantly increased and an S/N ratio is effectively improved.

Furthermore, using a method according to various preferred embodiments of the present invention, a separating portion with a non-uniform width is easily formed, and a tuning fork-type vibrator having the above-described feature can be efficiently manufactured.

The above and other elements, features, arrangements, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
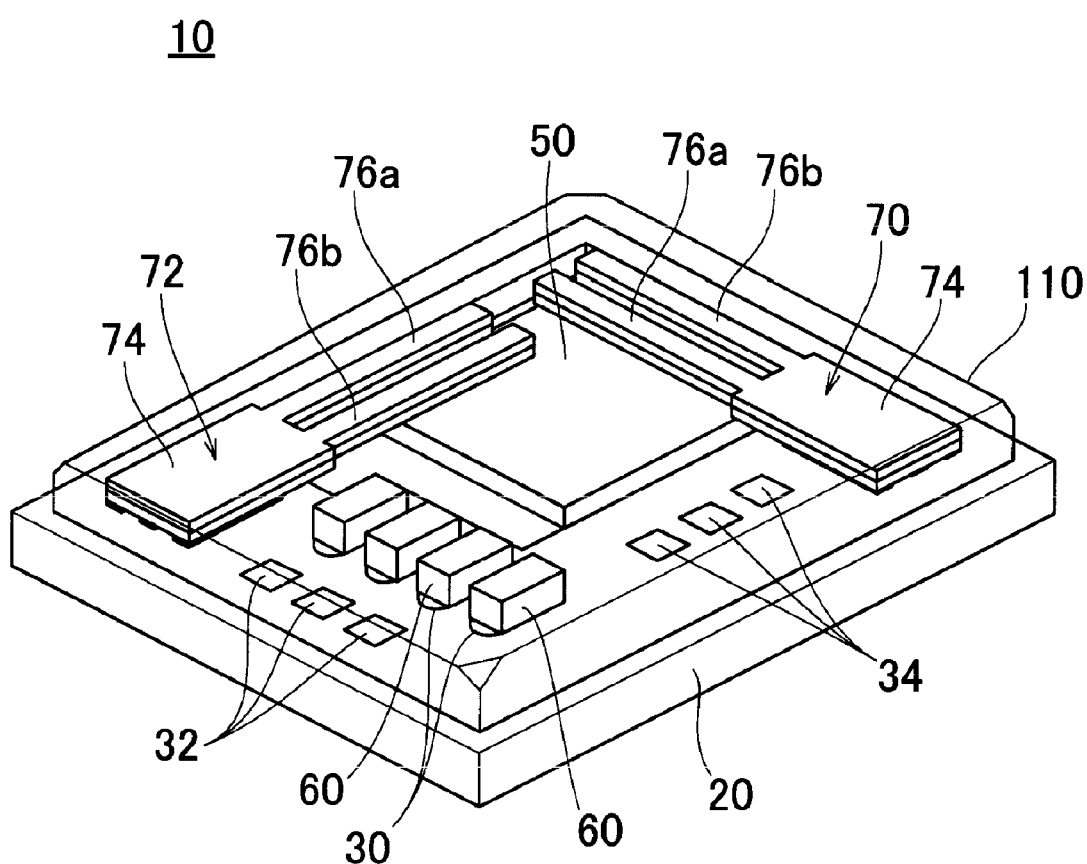
FIG. 1 is an internal perspective view of an example of an angular velocity sensor using a tuning fork-type vibrator according to a preferred embodiment of the present invention.
Figure 2:
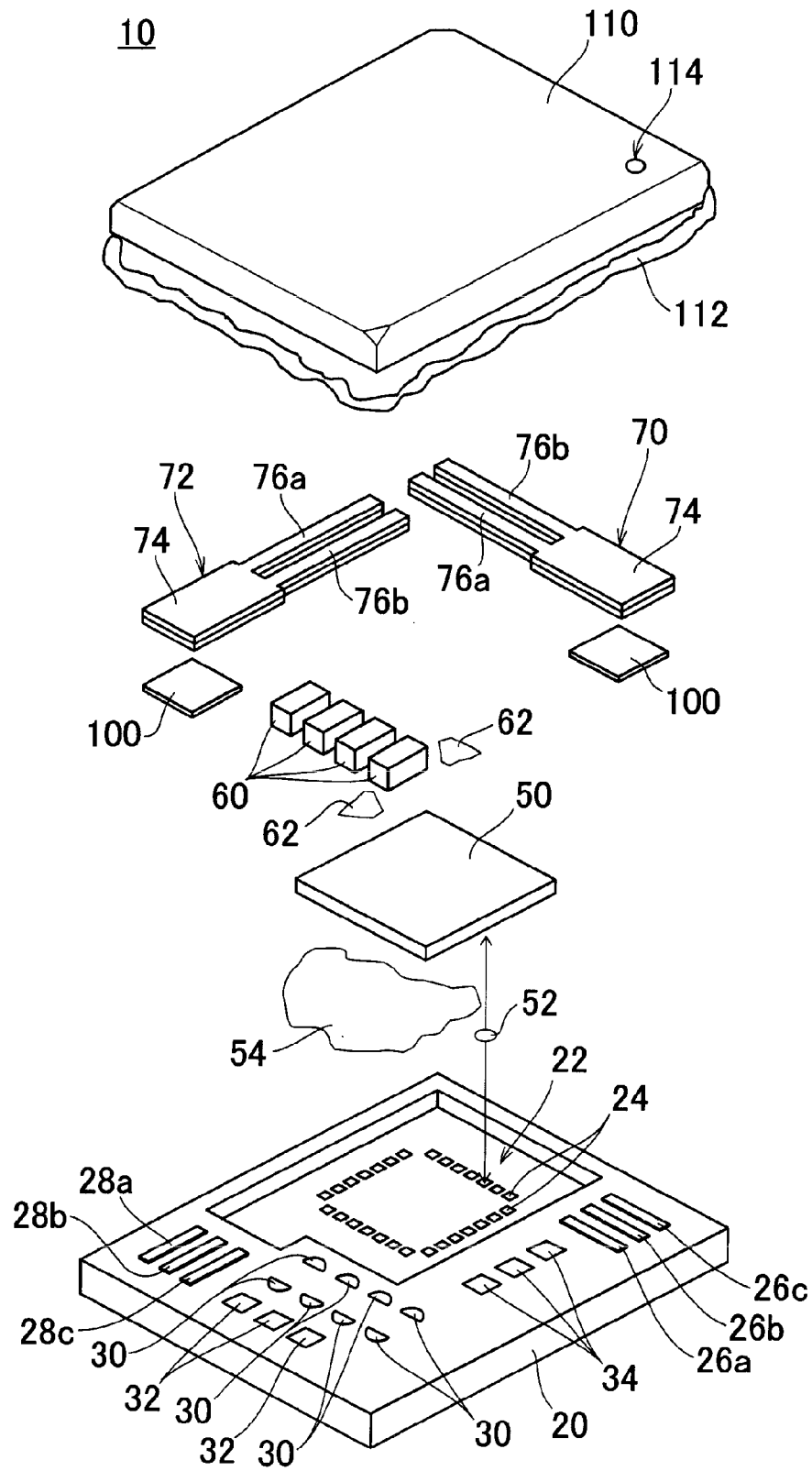
FIG. 2 is an exploded perspective view of the angular velocity sensor illustrated in FIG. 1.

FIG. 1 is an internal perspective view of an angular velocity sensor using a tuning fork-type vibrator according to a preferred embodiment of the present invention. FIG. 2 is an exploded perspective view of the angular velocity sensor. An angular velocity sensor 10 includes a circuit board 20. The circuit board 20 is preferably a rectangular or substantially rectangular plate, for example. A recess 22 is preferably provided on a first surface of the circuit board 20. For example, the recess 22 is preferably arranged near one corner of the circuit board 20. Referring to FIG. 2, the recess 22 is preferably hook-shaped, for example. However, the recess 22 may be, for example, rectangular or substantially rectangular as long as it can accommodate an IC to be described later.

Inside the recess 22 of the circuit board 20, a plurality of electrodes 24 are preferably arranged, for example, in the form of a square. Outside the recess 22 of the circuit board 20 and near a short side of the circuit board 20 close to the recess 22, three rectangular electrodes 26a, 26b, and 26c are provided. The electrodes 26a to 26c are preferably arranged so that the longitudinal direction thereof is the same as the direction of the short side of the circuit board 20 close to the recess 22. Outside the recess 22 of the circuit board 20 and near a long side of the circuit board 20 close to the recess 22, three rectangular electrodes 28a, 28b, and 28c are provided. The electrodes 28a to 28c are preferably arranged so that the longitudinal direction thereof is the same as the direction of the long side of the circuit board 20 close to the recess 22.

Between the recess 22 and a short side of the circuit board 20 spaced apart from the recess 22, a plurality of pairs of counter electrodes 30 are provided. The counter electrodes 30 in each pair are preferably opposed to each other in the longitudinal direction of the circuit board 20. These pairs of the counter electrodes 30 are preferably arranged along the short side of the circuit board 20. Between the counter electrodes 30 and the short side of the circuit board 20, a plurality of electrodes 32 are provided. A plurality of electrodes 34 are provided near the electrodes 26a to 26c arranged near the short side of the circuit board 20 close to the recess 22. The electrodes 34 are preferably arranged along a long side of the circuit board 20 spaced apart from the recess 22.

Figure 3:
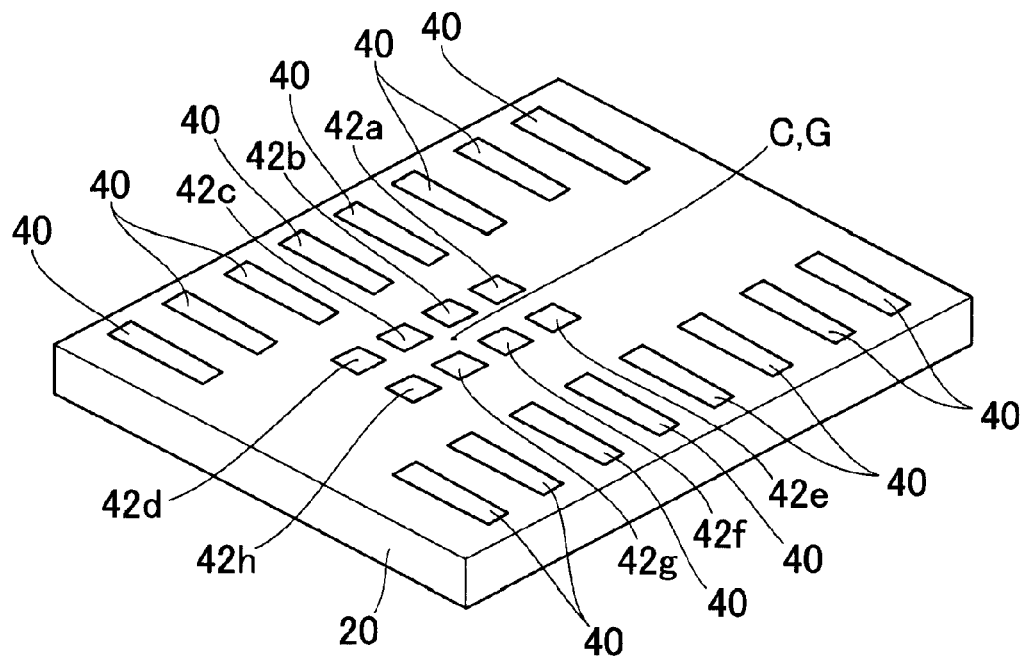
FIG. 3 is a perspective view illustrating a second surface of a circuit board used in the angular velocity sensor illustrated in FIGS. 1 and 2.

On a second surface of the circuit board 20, as illustrated in FIG. 3, a plurality of external electrodes 40 and eight inspection electrodes 42a to 42h are provided. The external electrodes 40 are preferably arranged along opposite long sides of the circuit board 20. The inspection electrodes 42a to 42h are preferably arranged inside the external electrodes 40. Four inspection electrodes 42a to 42d are preferably arranged along one of the opposite long sides of the circuit board 20, and the other four inspection electrodes 42e to 42h are preferably arranged along the other one of the opposite long sides of the circuit board 20. A center point C of the eight inspection electrodes 42a to 42h on the second surface of the circuit board 20 preferably corresponds to a position G of the barycenter of the angular velocity sensor 10.

The circuit board 20 is preferably made of, for example, alumina. The electrodes 24, 26a to 26c, 28a to 28c, 30, 32, 34, 40, and 42a to 42h on the circuit board 20 are preferably formed, for example, by sequentially plating each electrode made of tungsten with nickel and gold. The circuit board 20 preferably includes many conductive wiring members (not illustrated), such as via holes and patterns.

An IC 50 is disposed in the recess 22 of the circuit board 20. The IC 50 is used to drive tuning fork-type vibrators to be described later and to process signals output from the tuning fork-type vibrators. The IC 50 includes a plurality of external electrodes (not illustrated) that are individually connected to the electrodes 24 in the recess 22. At that time, for example, gold bumps 52 are preferably individually formed on the electrodes 24 and arranged to connect between a corresponding one of the electrodes 24 and a corresponding one of the external electrodes of the IC 50. The IC 50 is fixed to the circuit board 20 preferably using underfill 54 made of, for example, an epoxy adhesive.

Chip capacitors 60 are preferably individually connected to the counter electrodes 30 provided on the circuit board 20. As the chip capacitors 60, for example, multilayer ceramic capacitors are preferably used. External electrodes provided at both ends of each of the chip capacitors 60 are preferably connected to corresponding ones of the counter electrodes 30 using solder 62, for example.

A first tuning fork-type vibrator 70 is preferably attached to the electrodes 26a to 26c disposed outside the recess 22, and a second tuning fork-type vibrator 72 is preferably attached to the electrodes 28a to 28c disposed outside the recess 22. Each of the first tuning fork-type vibrator 70 and the second tuning fork-type vibrator 72 includes a tuning fork-type vibrating body 78 preferably having a substantially rectangular base 74, for example, and two legs 76a and 76b extending from one end of the base 74 in the longitudinal direction. The legs 76a and 76b extend in parallel or substantially in parallel inside both ends of the base 74 in the width direction.

Figure 4:
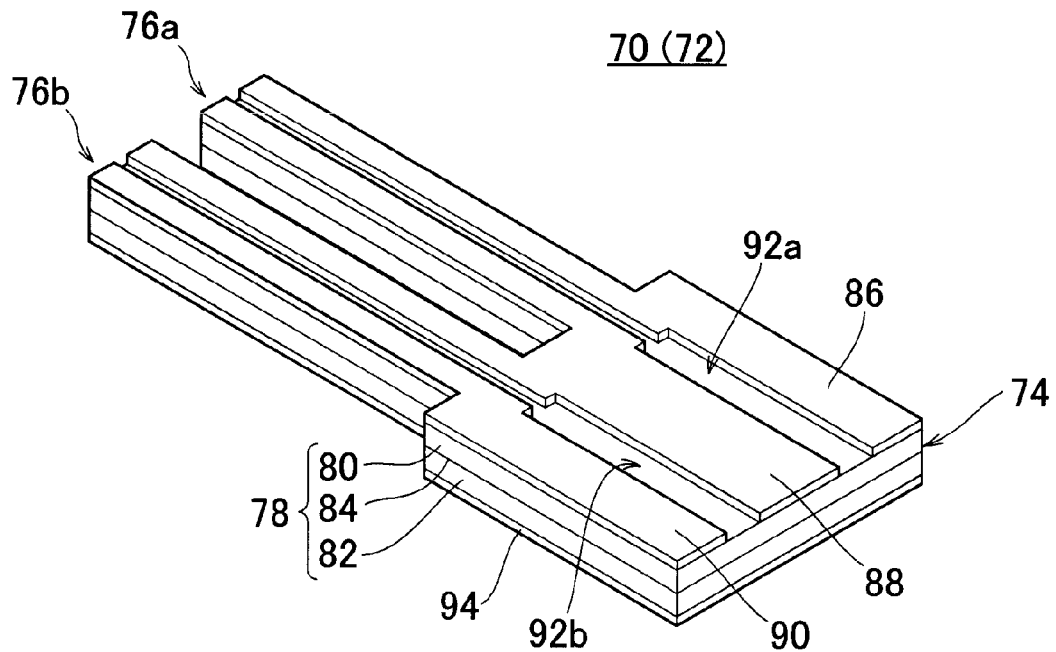
FIG. 4 is a perspective view of a tuning fork-type vibrator according to a preferred embodiment of the present invention used in the angular velocity sensor illustrated in FIGS. 1 and 2.

As illustrated in FIG. 4, the tuning fork-type vibrating body 78 in each of the first tuning fork-type vibrator and the second tuning fork-type vibrator 72 preferably includes two tuning fork-type piezoelectric substrates 80 and 82, and an intermediate electrode 84 that is sandwiched between the piezoelectric substrates 80 and 82. The piezoelectric substrates 80 and 82 are preferably made of a piezoelectric material, such as lead zirconate titanate (PZT), for example, and are preferably polarized, for example, in opposite thickness directions.

Three surface electrodes 86, 88, and 90 are preferably provided on the surface of the piezoelectric substrate 80. The surface electrodes 86 and 88 are separated from each other by a separating portion 92a extending from the base 74 to the leg 76a through the center of the leg 76a in the width direction, and the surface electrode 86 on one side extends from the base 74 to the leg 76a. Preferably, the surface electrodes 88 and 90 are separated from each other by a separating portion 92b extending from the base 74 to the leg 76b through the center of the leg 76b in the width direction, and the surface electrode 90 on the other side extends from the base 74 to the leg 76b. The middle surface electrode 88 preferably extends from the base 74 to both the legs 76b and 76b. Preferably, the width of the separating portion 92a between the surface electrodes 86 and 88 is wide at the base 74 and is narrow at the leg 76a. Preferably, the width of the separating portion 92b between the surface electrodes 90 and 88 is wide at the base 74 and is narrow at the leg 76b. On the surface of the piezoelectric substrate 82, an entire-surface electrode 94 is preferably provided.

The first fork tuning-type piezoelectric vibrator 70 and the second fork tuning-type piezoelectric vibrator 72 are attached to the electrodes 26a to 26c and the electrodes 28a to 28c, respectively, disposed outside the recess 22 of the circuit board 20. At that time, the surface electrodes 86, 88, and 90 of the first tuning fork-type vibrator 70 are connected to the electrodes 26a, 26b, and 26c, respectively, using a bonding material 100, and the surface electrodes 86, 88, and 90 of the second tuning fork-type vibrator 72 are connected to the electrodes 28a, 28b, and 28c, respectively, using the bonding material 100. As the bonding material 100, for example, an anisotropic conductive adhesive, a conductive adhesive, a resin-metal composite material, a gold bump, or other suitable bonding material is preferably used. Insulation must be ensured among the surface electrode 86, 88, and 90. Accordingly, when an anisotropic conductive adhesive or a resin-metal composite material is used as the bonding material 100, the bonding material 100 can be applied to the entire surface of the base 74 on which the three electrodes 86, 88, and 90 are disposed. When another material is used, it is necessary to separately apply the bonding material 100 to the surface electrodes 86, 88, and 90.

The first tuning fork-type piezoelectric vibrator 70 and the second tuning fork-type piezoelectric vibrator 72 are preferably arranged in substantially perpendicular directions, and have different resonant frequencies so as to prevent the vibration of each vibrator from exerting an effect on the other vibrator. The legs 76a and 76b of the first tuning fork-type piezoelectric vibrator 70 are preferably longer than those of the second tuning fork-type piezoelectric vibrator 72. Accordingly, the first tuning fork-type piezoelectric vibrator 70 preferably has a resonant frequency lower than that of the second tuning fork-type piezoelectric vibrator 72.

The surface electrodes 86, 88, and 90 of the first tuning fork-type piezoelectric vibrator 70 having the lower resonant frequency are connected to the electrodes 26a, 26b, and 26c, respectively, disposed near the short side of the circuit board 20. The surface electrodes 86, 88, and 90 of the second tuning fork-type piezoelectric vibrator 72 having the higher resonant frequency are connected to the electrodes 28a to 28c, respectively, disposed near the long side of the circuit board 20. The legs 76a and 76b of the first tuning fork-type vibrator 70 extend toward the recess 22 along the short side of the circuit board 20. The legs 76a and 76b of the second tuning fork-type vibrator 72 extend toward the recess 22 along the long side of the circuit board 20.

A circuit including the IC 50 and the chip capacitors is connected to the external electrodes 40 on the second surface of the circuit board 20 via the electrodes 24, the counter electrodes 30, and wiring members (not illustrated). The surface electrodes 86, 88, and 90 of the first tuning fork-type vibrator 70 and the surface electrodes 86, 88, and 90 of the second tuning fork-type vibrator 72 are connected to a circuit in the IC 50 and the inspection electrodes 42a to 42h on the second surface of the circuit board 20 via the electrodes 26a to 26c, the electrodes 28a to 28c, and wiring members (not illustrated). At that time, the surface electrodes 86, 88, and of the first tuning fork-type vibrator 70 and the surface electrodes 86, 88, and 90 of the second tuning fork-type vibrator 72 are connected to the four inspection electrodes 42a to 42d and the four inspection electrodes 42e to 42h, respectively, which are arranged in two lines.

The middle surface electrode 88 of the first tuning fork-type piezoelectric vibrator 70 is preferably connected to the two outer inspection electrodes 42a and 42d among the four inspection electrodes 42a to 42d arranged side by side, and the outer surface electrodes 86 and 90 of the first tuning fork-type vibrator 70 are preferably connected to the two inner inspection electrodes 42b and 42c. The middle surface electrode 88 of the second tuning fork-type vibrator 72 is preferably connected to the two outer inspection electrodes 42e and 42h among the four inspection electrodes 42e to 42h arranged side by side, and the outer surface electrodes 86 and 90 of the second tuning fork-type vibrator 72 are preferably connected to the two inner inspection electrodes 42f and 42g.

A cap 110 is mounted on the first surface of the circuit board 20 so as to cover the IC 50, the chip capacitors 60, the first tuning fork-type vibrator 70, and the second tuning fork-type vibrator 72. The cap 110 is preferably made of a material, such as alumina or German silver, for example, and preferably is a rectangular or substantially rectangular container having outer dimensions corresponding to those of the circuit board 20.

In order to mount the cap 110 on the circuit board 20, a cap adhesive 112 is preferably applied between the edges of the cap 110 and the circuit board 20. When the cap 110 is an insulative cap made of, for example, alumina, an epoxy adhesive is preferably used as the cap adhesive 112 for mounting of the cap 110. When the cap 110 is a conductive cap made of, for example, German silver, an epoxy adhesive and an epoxy conductive adhesive are preferably used as the cap adhesive 112 for mounting of the cap 110.

The cap 110 includes an explosion-proof through hole 114. The through hole 114 is preferably provided at a position near a corner of the cap 110 corresponding to the base 74 of the first tuning fork-type piezoelectric vibrator 70. Alternatively, the through hole 114 may be provided at a portion near a corner of the cap 110 corresponding to the base 74 of the second tuning fork-type piezoelectric vibrator 72. That is, the through hole 114 is preferably arranged so as not be disposed over the IC 50 even if the cap 110 is rotated by 180° and is then mounted on the circuit board 20.

Figure 5:
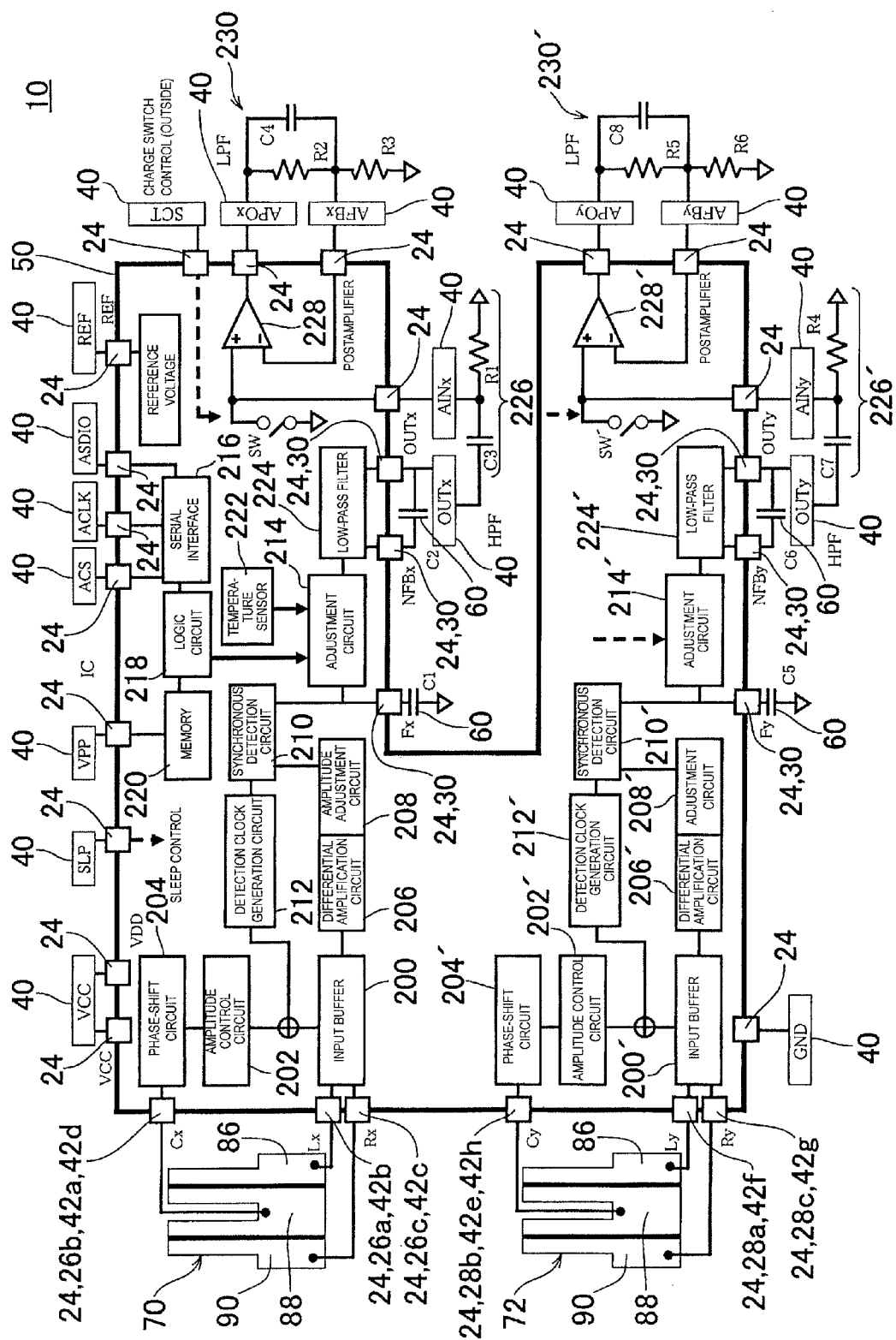
FIG. 5 is a block diagram illustrating a circuit in the angular velocity sensor illustrated in FIGS. 1 and 2.

Next, the circuit configuration of the angular velocity sensor 10 will be described with reference to FIG. 5. In the angular velocity sensor 10, the circuit configuration of the first tuning fork-type piezoelectric vibrator 70 and the circuit configuration of the second tuning fork-type piezoelectric vibrator 72 are similar to each other. Accordingly, first, the circuit configuration of the first tuning fork-type piezoelectric vibrator 70 will be described in detail, and then the circuit configuration of the second tuning fork-type piezoelectric vibrator 72 will be briefly described.

In the angular velocity sensor 10, the surface electrodes 86 and 90 of the first tuning fork-type piezoelectric vibrator 70 are connected to two input terminals of an input buffer 200 included in the IC 50 via the electrodes 24, 26a, and 26c and wiring members (not illustrated). The input buffer 200 includes one first output terminal and two second output terminals. The first output terminal is used to output a signal having the sum of signals input into the two input terminals. The two second output terminals are used to output signals input into the two input terminals. In the IC 50, the first output terminal of the input buffer 200 is connected to an input terminal of an amplitude control circuit 202 arranged to control the amplitude of a signal. An output terminal of the amplitude control circuit 202 is connected to an input terminal of a phase-shift circuit 204 arranged to correct the phase of a signal. An output terminal of the phase-shift circuit 204 in the IC 50 is connected to the surface electrode 88 of the first tuning fork-type piezoelectric vibrator 70 via the electrodes 24 and 26b and wiring members (not illustrated). Thus, a drive feedback loop is provided in the first tuning fork-type piezoelectric vibrator 70. The surface electrodes 86, 88, and 90 of the first tuning fork-type piezoelectric vibrator 70 are connected to the four inspection electrodes 42a to 42d as above.

In the IC 50, the two second output terminals of the input buffer 200 are connected to two input terminals of a differential amplification circuit 206. An output terminal of the differential amplification circuit 206 is connected to a first input terminal of a synchronous detection circuit 210 via an amplitude adjustment circuit 208. The first output terminal of the input buffer 200 is also connected to a second input terminal of the synchronous detection circuit 210 via a detection clock generation circuit 212. The synchronous detection circuit 210 detects a signal input into the first input terminal thereof in synchronization with a signal (a detection clock) input into the second input terminal thereof. An output terminal of the synchronous detection circuit 210 is connected to one external electrode (one of the electrodes 24) of the IC 50, and a capacitor C1 (one of the chip capacitors 60) is connected between this external electrode and another external electrode (another one of the electrodes 24 corresponding to one of the external electrodes 40 (REF)) of the IC 50 to which a reference voltage is applied via one of the electrodes 30 and a wiring member (not illustrated).

In the IC 50, the output terminal of the synchronous detection circuit 210 is also connected to a first input terminal of an adjustment circuit 214. The adjustment circuit 214 is arranged to perform temperature compensation on a signal output from the synchronous detection circuit 210. Therefore, the IC 50 includes a serial interface 216, a logic circuit 218, a memory 220, and a temperature sensor 222. Three input terminals of the serial interface 216 are individually connected to three external electrodes (three of the electrodes 24) of the IC 50 and three of the external electrodes 40 (ACS, ACLK, and ASDIO). An output terminal of the serial interface 216 is connected to an input terminal of the logic circuit 218. An input/output terminal of the logic circuit 218 is connected to an input/output terminal of the memory 220. A VPP voltage terminal of the memory 220 is connected to an external electrode (one of the electrodes 24) of the IC 50 and one of the external electrodes 40 (VPP). Thus, various pieces of data including data related to an actually measured temperature characteristic of an impedance of the first tuning fork-type piezoelectric vibrator 70 can be stored from the external electrode 40 into the memory 220 via the serial interface 216 and the logic circuit 218. An output terminal of the logic circuit 218 is connected to a second input terminal of the adjustment circuit 214. Data stored in the memory 220 can therefore be supplied to the adjustment circuit 214 via the logic circuit 218. An output terminal of the temperature sensor 222 is connected to a third input terminal of the adjustment circuit 214. The adjustment circuit 214 can therefore perform temperature compensation on a signal output from the synchronous detection circuit 210 based on data stored in the memory 220 and a signal output from the temperature sensor 222.

Although not illustrated, the memory 220 is also connected to the amplitude adjustment circuit 208. The amplitude adjustment circuit 208 can adjust the amplitude of a signal output from the differential amplification circuit 206 based on gain data stored in the memory 220.

In the IC 50, an output terminal of the adjustment circuit 214 is connected to an input terminal of a low-pass filter 224. The low-pass filter 224 passes an angular velocity signal having a frequency in a low frequency band of, for example, about 10 Hz to about 50 Hz, detected by the angular velocity sensor 10. A first output terminal of the low-pass filter 224 is connected to an external electrode (one of the electrodes 24) of the IC 50, one of the electrodes 30, and one of the external electrodes 40 (OUTx). The low-pass filter 224 includes a second output terminal arranged to pass and output an input signal, and the second output terminal of the low-pass filter 224 is connected to another external electrode (another one of the electrodes 24) of the IC 50 and another one of the electrodes 30. A capacitor C2 (one of the chip capacitors 60) is connected between the first and second output terminals of the low-pass filter 224 (between the electrodes 30).

The first output terminal of the low-pass filter 224, that is, the external electrode 40 (OUTx), is connected to an input terminal of an externally provided high-pass filter 226. The high-pass filter 226 is arranged to cut off a direct-current component in a signal. The high-pass filter 226 includes a capacitor C3 and a resistor R1. The capacitor C3 is connected between the input terminal and an output terminal of the high-pass filter 226. The resistor R1 is connected between the output terminal of the high-pass filter 226 and the external electrode 40 (REF) to which the reference voltage of the IC 50 is applied.

The output terminal of the high-pass filter 226, that is, the node between the capacitor C3 and the resistor R1, is connected to one of the external electrodes 40 (AINx). The external electrode 40 (AINx) is connected to a positive input terminal of an operational amplifier 228 in a first postamplifier of the IC 50 via one of the electrodes 24. The first postamplifier amplifies the amplitude of a signal input into the external electrode 40 (AINx), for example, approximately fifty fold. A negative input terminal of the operational amplifier 228 is connected to one of the external electrodes 40 (AFBx) via one of the electrodes 24, and an output terminal of the operational amplifier 228 is connected to another one of the external electrodes 40 (APOx) via another one of the electrodes 24. An externally provided low-pass filter 230 is connected to the external electrodes 40 (AFBx and APOx). The low-pass filter 230 includes a resistor R2 and a capacitor C4, which are connected in parallel between the external electrodes 40 (AFBx and APOx). A resistor R3 is connected between the external electrode 40 (AFBx) and the external electrode 40 (REF) to which the reference voltage is applied. The postamplifier including the operational amplifier 228 can therefore amplify the amplitude of a signal input into the external electrode 40 (AINx), for example, approximately fifty fold and output the amplified signal from the output terminal of the operational amplifier 228, that is, the external electrode 40 (APOx).

The IC 50 includes a switch SW. The switch SW is connected between an external electrode (one of the electrodes 24) of the IC 50 connected to the external electrode 40 (AINx) and another electrode (another one of the electrodes 24) of the IC 50 connected to the external electrode 40 (REF) to which the reference voltage is applied. The switch SW is also connected to an external electrode (one of the electrodes 24) of the IC 50 connected to one of the external electrodes 40 (SCT). The switch SW can be turned on or off in accordance with a control signal input into the external electrode 40 (SCT). When the capacitor C3 in the high-pass filter 226 is charged by holding the switch SW in an ON state for, for example, about 0.2 seconds, a signal is rapidly transmitted from the output terminal of the low-pass filter 224, that is, the external electrode 40 (OUTx), to the positive input terminal of the operational amplifier 228. This can reduce the rising time of an output signal at the output terminal of the operational amplifier 228, that is, the external electrode 40 (APOx).

One of the external electrodes 40 (VCC) is connected to the electrodes 24 connected to the VCC and VDD of the IC 50 via wiring members (not illustrated). One of the external electrodes 40 (GND) is connected to one of the electrodes 24 connected to a GND of the IC 50 via a wiring member (not illustrated). One of the external electrodes 40 (SLP) is connected to one of the electrodes 24 connected to a sleep control terminal of the IC 50 via a wiring member (not illustrated).

In the angular velocity sensor 10, similar to the first tuning fork-type piezoelectric vibrator 70, the surface electrodes 86 and 90 of the second tuning fork-type piezoelectric vibrator 72 are connected to two input terminals of an input buffer 200', which is similar to the input buffer 200, included in the IC 50 via the electrodes 24, 28a, and 28c and wiring members (not illustrated). A first output terminal of the input buffer 200' is connected to the surface electrode 88 of the second tuning fork-type piezoelectric vibrator 72 via an amplitude control circuit 202' similar to the amplitude control circuit 202, a phase-shift circuit 204' similar to the phase-shift circuit 204, the electrodes 24 and 28b and wiring members (not illustrated). Thus, a drive feedback loop is also provided in the second tuning fork-type piezoelectric vibrator 72. This drive feedback loop is preferably configured so that a drive frequency for the second tuning fork-type piezoelectric vibrator is higher than that for the first tuning fork-type piezoelectric vibrator 70.

Two second output terminals of the input buffer 200' are also connected to a first input terminal of a synchronous detection circuit 210' similar to the synchronous detection circuit 210 via a differential amplification circuit 206' similar to the differential amplification circuit 206 and an amplitude adjustment circuit 208' similar to the amplitude adjustment circuit 208. The first output terminal of the input buffer 200' is also connected to a second input terminal of the synchronous detection circuit 210' via a detection clock generation circuit 212' similar to the detection clock generation circuit 212. Although not illustrated, the memory 220 is also connected to the adjustment circuit 208'. The amplitude adjustment circuit 208' can adjust the amplitude of a signal output from the differential amplification circuit 206' based on gain data stored in the memory 220. The detection clock generation circuit 212' generates a detection clock having a cycle shorter than that generated by the detection clock generation circuit 212 in accordance with the higher drive frequency for the second tuning fork-type piezoelectric vibrator 72. The cycle of detection of the synchronous detection circuit 210' is also shorter than that of the synchronous detection circuit 210.

An output terminal of the synchronous detection circuit 210' is connected to one external electrode (one of the electrodes 24) of the IC 50 and one of the electrodes 30. A capacitor C5 (one of the chip capacitors 60) is connected between the electrode 30 and another external electrode (another one of the electrodes 24 corresponding to the external electrode 40 (REF)) of the IC 50 to which a reference voltage is applied.

In the IC 50, the output terminal of the synchronous detection circuit 210' is also connected to a first input terminal of an adjustment circuit 214' similar to the adjustment circuit 214. The memory 220 and the temperature sensor 222 are connected to second and third input terminals of the adjustment circuit 214', respectively. Data stored in the memory 220 can therefore be supplied to the adjustment circuit 214'. The adjustment circuit 214' can therefore perform temperature compensation on a signal output from the synchronous detection circuit 210' based on data related to the second tuning fork-type vibrator 72 stored in the memory 220 and a signal output from the temperature sensor 222.

In the IC 50, an output terminal of the adjustment circuit 214' is connected to an input terminal of a low-pass filter 224' similar to the low-pass filter 224. A first output terminal of the low-pass filter 224' is connected to an external electrode (one of the electrodes 24) of the IC 50, one of the electrodes 30, and one of the external electrodes 40 (OUTy). A second output terminal of the low-pass filter 224' is connected to another external electrode (another one of the electrodes 24) of the IC 50 and another one of the electrodes 30. A capacitor C6 (one of the chip capacitors 60) is connected between the first and second output terminals of the low-pass filter 224' (between the electrodes 30).

The first output terminal of the low-pass filter 224', that is, the external electrode 40 (OUTy), is connected to an input terminal of an externally provided high-pass filter 226' similar to the high-pass filter 226. A capacitor C7 is connected between an input terminal and an output terminal of the high-pass filter 226'. A resistor R4 is connected between the output terminal of the high-pass filter 226' and the external electrode 40 (REF) to which the reference voltage of the IC 50 is applied.

The output terminal of the high-pass filter 226', that is, the node between the capacitor C7 and resistor R4, is connected to one of the external electrodes 40 (AINy). The external electrode 40 (AINy) is connected to a positive input terminal of an operational amplifier 228' used in a second postamplifier similar to the first postamplifier of the IC 50 via one of the electrodes 24. The second postamplifier amplifies the amplitude of a signal input into the external electrode 40 (AINy), for example, approximately fifty fold. A negative input terminal of the operational amplifier 228' is connected to one of the external electrodes 40 (AFBy) via one of the electrodes 24. An output terminal of the operational amplifier 228' is connected to another one of the external electrodes 40 (APOy) via another one of the electrodes 24. An externally provided low-pass filter 230' similar to the low-pass filter 230 is connected to the external electrodes 40 (AFBy and APOy). A resistor R5 and a capacitor C8 in the low-pass filter 230' are connected in parallel between the external electrodes 40 (AFBy and APOy). A resistor R6 is connected between the external electrode 40 (AFBy) and the external electrode 40 (REF) to which the reference voltage is applied. The second postamplifier including the operational amplifier 228' can amplify the amplitude of a signal input into the external electrode 40 (AINy), for example, approximately fifty fold and output the amplified signal from the output terminal thereof, that is, the external electrode 40 (APOy).

The IC 50 includes a switch SW' similar to the switch SW. The switch SW' is connected between an external electrode (one of the electrodes 24) of the IC 50 connected to the external electrode 40 (AINy) and another external electrode (another one of the electrodes 24) of the IC 50 connected to the external electrode 40 (REF) to which the reference voltage of the IC 50 is applied. The switch SW' is also connected to an external electrode (one of the electrodes 24) of the IC 50 and the external electrode 40 (SCT). The switch SW can also be turned on or off in accordance with a control signal input into the external electrode 40 (SCT). When the capacitor C7 in the high-pass filter 226' is charged by holding the switch SW' in an ON state for, for example, about 0.2 seconds, a signal is rapidly transmitted from the first output terminal of the low-pass filter 224', that is, the external electrode 40 (OUTy), to the positive input terminal of the operational amplifier 228'. This reduces the rising time of an output signal at the output terminal of the operational amplifier 228', that is, the external electrode 40 (APOy).

Next, the operating state of the angular velocity sensor 10 will be described. In the angular velocity sensor 10, for example, the first tuning fork-type piezoelectric vibrator 70 is used to detect a rotational angular velocity applied about the X axis parallel or substantially parallel to the short sides of the circuit board 20 and the second tuning fork-type piezoelectric vibrator 72 is used to detect a rotational angular velocity applied about the Y axis parallel or substantially parallel to the long sides of the circuit board 20.

Figure 6:
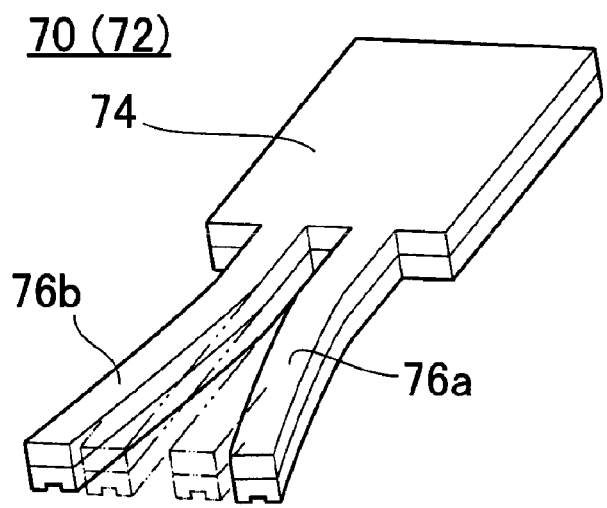
FIG. 6 is a diagram illustrating a vibration state of a tuning fork-type vibrator when the tuning fork-type vibrator is driven.

In the first tuning fork-type piezoelectric vibrator 70, a self-excitation drive circuit is defined by the drive feedback loop including the input buffer 200, the amplitude control circuit 202, and the phase-shift circuit 204. For example, as illustrated in FIG. 6, the legs 76a and 76b perform fundamental vibrations such that they move toward and away from each other. In a state in which the legs 76a and 76b are opened (in a state represented by a solid line in FIG. 6), a center portion of the first tuning fork-type piezoelectric vibrator 70 at which the surface electrode 88 is provided expands and portions on both sides of the center portion of the first tuning fork-type vibrator 70 at which the surface electrodes 86 and 90 are individually provided contract. In contrast, in a state in which the legs 76a and 76b are closed, the center portion of the first tuning fork-type piezoelectric vibrator 70 contracts and the portions on both sides of the center portion of the first tuning fork-type vibrator 70 at which the surface electrodes 86 and 90 are individually provided expand. At the time of the fundamental vibrations, the two legs 76a and 76b vibrate symmetrically in the same state with respect to polarized directions. Accordingly, the same signal is output from the outer surface electrodes 86 and 90. A signal having a value of "0" is output from the differential amplification circuit 206, which is a detection circuit, and the external electrode 40 (APOx).

Figure 7:
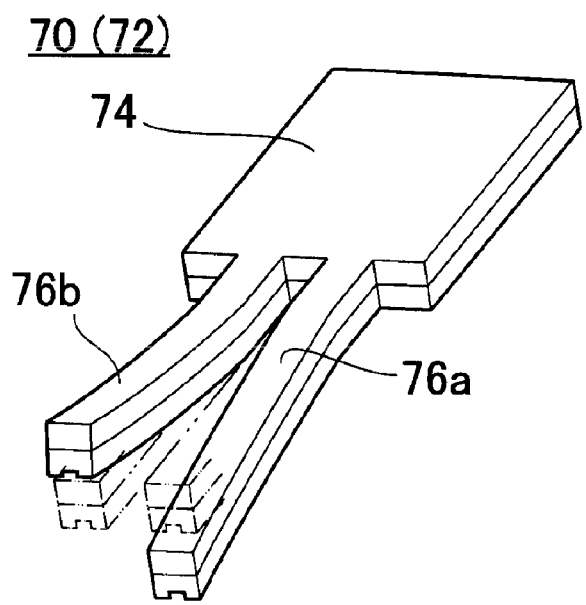
FIG. 7 is a diagram illustrating a vibration state of a tuning fork-type vibrator when a rotational angular velocity is applied to the tuning fork-type vibrator.

When a rotational angular velocity about the X axis is applied to the first tuning fork-type vibrator 70 at the time of the fundamental vibrations, a Coriolis force is applied to the legs 76a and 76b in directions perpendicular or substantially perpendicular to the directions of the fundamental vibrations. Since the Coriolis forces on the legs 76a and 76b are applied in opposite directions, the two legs 76a and 76b are displaced in opposite directions as illustrated in, for example, FIG. 7. As a result, the outer surface electrodes 86 and 90 output signals having opposite phases, and the differential amplification circuit 206 outputs a signal having a large value corresponding to the rotational angular velocity. The magnitude and polarity of the output signal are determined in accordance with a rotational angular velocity and a rotation direction, respectively.

The amplitude of a signal output from the differential amplification circuit 206 is adjusted by the amplitude adjustment circuit 208 on the basis of data stored in the memory 220. The amplitude-adjusted signal is detected by the synchronous detection circuit 210 in synchronization with a detection clock generated by the detection clock generation circuit 212. The detected signal is subjected to temperature compensation by the adjustment circuit 214. When the frequency of the temperature-compensated signal falls within a required low frequency band, the signal is passed by the low-pass filter 224. A direct-current component of the signal is cut off by the high-pass filter 226. Subsequently, the signal is amplified by the first postamplifier including the operational amplifier 228 and is then output from the output terminal of the operational amplifier 228, that is, the external electrode 40 (APOx). Accordingly, the rotational angular velocity about the X axis and the rotation direction can be detected based on the magnitude and polarity of the signal output from the external electrode 40 (APOx).

Similar to the first tuning fork-type piezoelectric vibrator 70, in the second tuning fork-type piezoelectric vibrator 72, the drive feedback loop including the input buffer 200' causes the legs 76a and 76b to perform fundamental vibrations. It should be noted that, in the second tuning fork-type piezoelectric vibrator 72, the directions of the fundamental vibrations of the legs 76a and 76b are changed in accordance with a rotational angular velocity about the Y axis. Accordingly, in the second tuning fork-type vibrator 72, the rotational angular velocity about the Y axis and a rotation direction can be detected based on the magnitude and polarity of a signal output from the differential amplification circuit 206' and the external electrode 40 (APOy).

Figure 8:
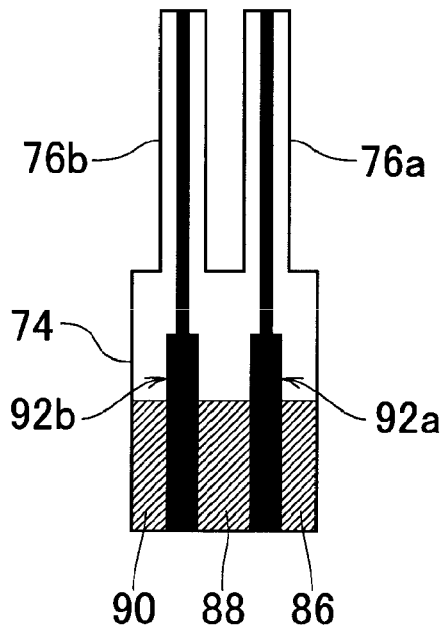
FIG. 8 is a plan view of the tuning fork-type vibrator according to the preferred embodiment of the present invention illustrated in FIG. 4.

In each of the first tuning fork-type vibrator 70 and the second tuning fork-type vibrator 72, the width of the separating portion 92a between the surface electrodes 86 and 88 and the width of the separating portion 92b between the surface electrodes 88 and 90 are preferably wide at the base 74, and the widths of the separating portions 92a and 92b are preferably narrow at the legs 76a and 76b, respectively. That is, the width of the separating portion 92a between the surface electrodes 86 and 88 at the base 74 is preferably greater than that of the separating portion 92a at the leg 76a, and the width of the separating portion 92b between the surface electrodes 88 and 90 at the base 74 is preferably greater than that of the separating portion 92b at the leg 76b. However, the width of the separating portion 92a between the surface electrodes 86 and 88 and the width of the separating portion 92b between the surface electrodes 88 and 90 may be changed at the base 74. For example, as represented by a diagonally shaded portion in FIG. 8, the width of the separating portion 92a may preferably be wide between portions of the surface electrodes 86 and 88 connected to the electrodes 26a and 26b or the electrodes 28a and 28b, and the width of the separating portion 92b may preferably be wide between portions of the surface electrodes 88 and 90 connected to the electrodes 26b and 26c or the electrodes 28b and 28c.

In order to provide the tuning fork-type vibrators 70 and 72, two piezoelectric substrates are preferably laminated via an electrode and electrodes are individually formed on the entire surfaces of this laminate, for example. In order to obtain a plurality of tuning fork-type vibrators from the laminate, the separating portions 92a and 92b for these tuning fork-type vibrators are formed on the laminate. At that time, by cutting the electrode on the piezoelectric substrate with a dicer, the separating portions 92a and 92b are formed at a plurality of positions on the laminate, for example.

The electrode on the piezoelectric substrate can preferably be divided by moving a rotating dicing blade while keeping the dicing blade in contact with the electrode. It is possible to form the separating portions 92a and 92b having non-uniform widths by using dicing blades whose cut widths are different. Alternatively, in order to form the separating portions 92a and 92b whose widths are partially wide, the electrode may be lineally divided into portions with a single dicing blade so that the width between the divided portions becomes uniform and the dicing blade may be brought into contact with portions of the divided portions of the electrode. At that time, the amount of widening of the divided portions of the electrode can preferably be adjusted by changing the number of contacts of the dicing blade. In addition, the length of a wide-width portion between the divided portions can be adjusted by moving the dicing blade along the divided portions while keeping the dicing blade into contact with the electrode. Subsequently, preferably, the laminate is cut into a plurality of tuning fork-type vibrators in which the separating portion 92a has a wide-width portion at the base 74 and a narrow-width portion at the leg 76a and the separating portion 92b has a wide-width portion at the base 74 and a narrow-width portion at the leg 76b. Thus, a plurality of tuning fork-type vibrators are obtained.

In the first tuning fork-type vibrator 70, the width between portions of the surface electrodes 86 and 88 connected to the electrodes 26a and 26b and the width between portions of the surface electrodes 88 and 90 connected to the electrodes 26b and 26c are preferably relatively wide. In the second tuning fork-type vibrator 72, the width between portions of the surface electrodes 86 and 88 connected to the electrodes 28a and 28b and the width between portions of the surface electrodes 88 and 90 connected to the electrodes 28b and 28c are preferably relatively wide. Accordingly, the probability that the surface electrodes 86, 88, and 90 are short circuited by a conductive adhesive arranged to connect the electrodes 26a to 26c and 28a to 28c of the circuit board 20 to the surface electrodes 86, 88, and 90 of the tuning fork-type vibrators 70 and 72 is significantly reduced, and the insulation reliability between the surface electrodes 86, 88, and 90 is increased.

Since the width of the separating portion 92a between the surface electrodes 86 and 88 is preferably relatively narrow at the leg 76a and the width of the separating portion 92b between the surface electrodes 88 and 90 is preferably relatively narrow at the leg 76b, the areas of the surface electrodes 86, 88, and 90 are effectively increased. Accordingly, the driving efficiency of the tuning fork-type vibrator 70 by a driving circuit is increased, and the outputting efficiency of signals generated by the displacements of the legs 76 and 76b from the surface electrodes 86 and 90, respectively is increased when a detection circuit processes the output signals. The sensitivities of the first tuning fork-type vibrator 70 and the second tuning fork-type vibrator 72 can therefore be effectively increased and an S/N ratio can be enhanced.

The separating portions 92a and 92b having non-uniform widths can be easily formed by bringing a dicing blade into contact with an electrode provided on the entire surface of a piezoelectric substrate, and the tuning fork-type vibrators 70 and 72 can be efficiently manufactured.

In order to form the separating portion 92a between the surface electrodes 86 and 88 and the separating portion 92b between the surface electrodes 88 and 90 in the tuning fork-type vibrators 70 and 72, the electrode provided on the entire surface of the piezoelectric substrate may be radiated with a laser, for example. Alternatively, in order to form the separating portions 92a and 92b in the tuning fork-type vibrators 70 and 72, a dividing pattern may be formed on the electrode by photolithography or other suitable method and portions of the electrode corresponding to the separating portions 92a and 92b may be removed by etching, for example.

Figure 9:
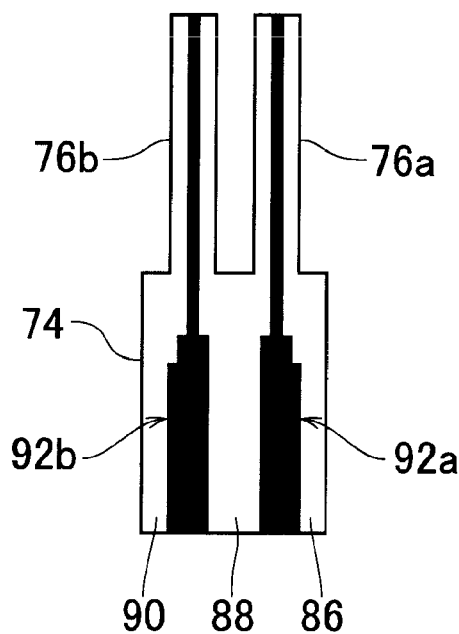
FIG. 9 is a plan view of a tuning fork-type vibrator according to another preferred embodiment of the present invention.
Figure 10:
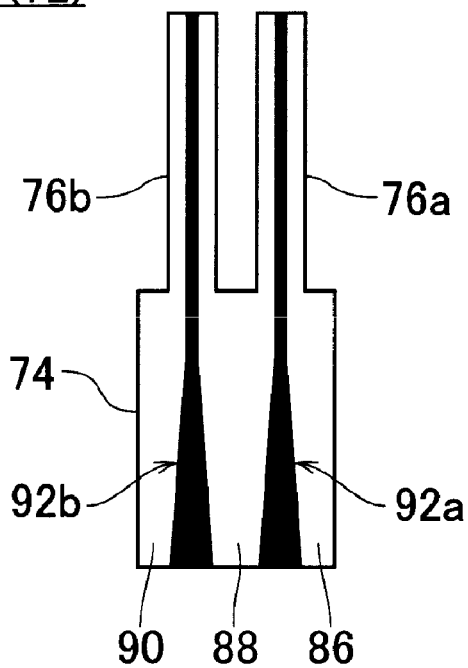
FIG. 10 is a plan view of a tuning fork-type vibrator according to still another preferred embodiment of the present invention.
Figure 11:
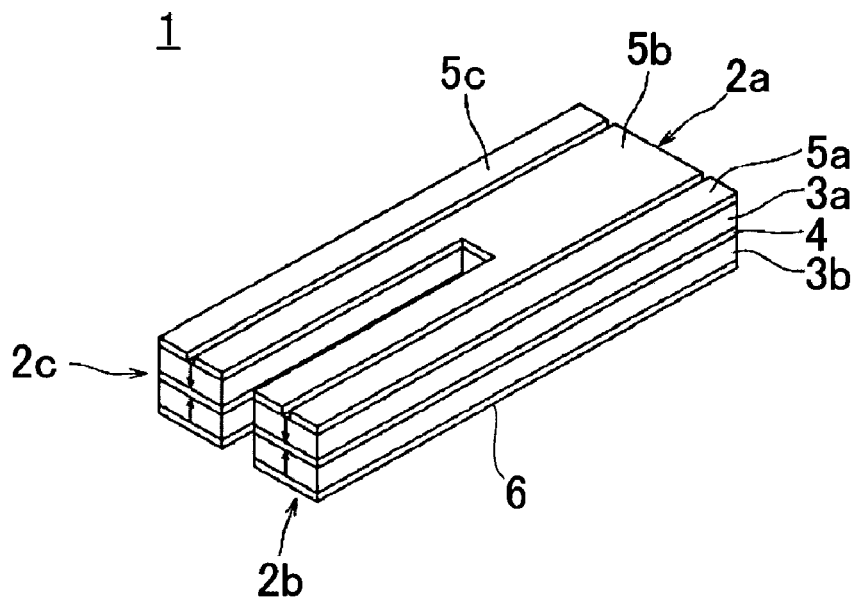
FIG. 11 is a perspective view of an example of a tuning fork-type vibrator in the related art.

When the separating portions 92a and 92b are formed in the electrode provided on the entire surface of the piezoelectric substrate by laser radiation or etching, for example, the widths and shapes of the separating portions 92a and 92b can be freely designed by changing a laser radiation position or accurately performing patterning for etching. For example, as illustrated in FIG. 9, a separating portion between the surface electrodes 86 and 88 may preferably have a crank-shaped portion between a narrow-width portion and a wide-width portion, and a separating portion between the surface electrodes 88 and 90 may preferably have a crank-shaped portion between a narrow-width portion and a wide-width portion. In addition, as illustrated in FIG. 10, the separating portion 92a having a width that gradually increases from the leg 76a towards the base 74 and the separating portion 92b having a width that gradually increases from the leg 76b towards the base 74 may preferably be provided, for example. Thus, the widths and shapes of the separating portion 92a between the surface electrodes 86 and 88 and the separating portion 92b between the surface electrodes 88 and 90 can be freely selected.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A tuning fork vibrator comprising:
   a tuning fork vibrating body including a piezoelectric substrate and including a base and legs extending in parallel or substantially in parallel from the base; and
   three surface electrodes disposed on the base and the legs and extending from the base and along the legs on one surface of the vibrating body and being directly connected to a circuit board at the base; wherein
   the three surface electrodes are separated by separating portions disposed on the base and the legs and extending from the base and along the legs; and
   widths of the separating portions at least a portion of the base at which the three surface electrodes are directly connected to the circuit board are greater than widths of the separating portions at the legs.

2. A method of manufacturing the tuning fork vibrator according to claim 1, comprising:
   forming a mother electrode on the piezoelectric substrate included in the tuning fork vibrating body; and
   forming the separating portions having non-uniform widths at least in a portion of the mother electrode with a dicer so as to separate the mother electrode into the three surface electrodes.

3. An angular velocity sensor comprising a tuning fork vibrator manufactured by the method according to claim 2.

4. A method of manufacturing the tuning fork vibrator according to claim 1, comprising:
   forming a mother electrode on the piezoelectric substrate included in the tuning fork vibrating body; and
   forming the separating portions so as to have non-uniform widths at least in a portion of the mother electrode by laser radiation so as to separate the mother electrode into the three surface electrodes.

5. An angular velocity sensor comprising a tuning fork vibrator manufactured by the method according to claim 4.

6. A method of manufacturing the tuning fork vibrator according to claim 1, comprising:
   forming a mother electrode on the piezoelectric substrate included in the tuning fork vibrating body; and
   forming the separating portions so as to have non-uniform widths at least in a portion of the mother electrode by etching so as to separate the mother electrode into the three surface electrodes.

7. An angular velocity sensor comprising a tuning fork vibrator manufactured by the method according to claim 6.

8. An angular velocity sensor comprising the tuning fork vibrator according to claim 1.

* * * * *